United States Patent [19]
Gurtler et al.

[11] Patent Number: 5,457,879
[45] Date of Patent: Oct. 17, 1995

[54] METHOD OF SHAPING INTER-SUBSTRATE PLUG AND RECEPTACLES INTERCONNECTS

[75] Inventors: Richard W. Gurtler, Mesa; Henry G. Hughes, Scottsdale, both of Ariz.

[73] Assignee: Motorola, Inc., Schaumburg, Ill.

[21] Appl. No.: 177,024

[22] Filed: Jan. 4, 1994

[51] Int. Cl.⁶ ............................................. H01L 21/70
[52] U.S. Cl. ..................... 29/895; 29/830; 156/630.1; 156/633.1; 437/192
[58] Field of Search ................................. 156/630, 633, 156/635, 901; 29/825, 830, 845; 437/192

[56] References Cited

U.S. PATENT DOCUMENTS

| | | |
|---|---|---|
| 4,612,554 | 9/1986 | Poleshuk . |
| 4,952,272 | 8/1990 | Okino et al. ........................... 156/630 |
| 4,963,511 | 10/1990 | Smith ..................................... 437/192 |
| 4,991,285 | 2/1991 | Shaheen et al. ....................... 29/845 X |
| 5,108,541 | 4/1992 | Schneider et al. .................... 156/901 X |

*Primary Examiner*—Carl J. Arbes
*Attorney, Agent, or Firm*—Robert D. Arkins

[57] ABSTRACT

A method electrically and mechanically interconnects two surfaces of high density first and second semiconductor devices. The first semiconductor device (10) is formed with plug members (22) connected to nodes (18) of its circuit elements (14) and protruding from the first semiconductor device. The second semiconductor device (24) is formed having receptacle members (36) connected to nodes (32) of its circuit elements (28) and protruding from the second semiconductor device. The plug members are inserted into the receptacle member to interconnect the first and second semiconductor devices. The plug members may be removed from the receptacle member to disconnect the first and second semiconductor devices.

17 Claims, 4 Drawing Sheets

METHOD OF SHAPING INTER-SUBSTRATE PLUG AND RECEPTACLES INTERCONNECTS

CROSS REFERENCE TO RELATED PATENT APPLICATIONS

The present application is further related to U.S. patent application Ser. No. 08/177,350 Attorney's Docket SC08547P, entitled "CIRCUIT AND METHOD OF FORMING VIAS THROUGH TWO-SIDED SUBSTRATE", filed Jan. 4, 1994, by Richard Gurtler et al and assigned to the same assignee, Motorola, Inc.

BACKGROUND OF THE INVENTION

The present invention relates in general to semiconductor interconnections and, more particularly, to shaped inter-substrate plug and receptacle interconnects.

Integrated circuits (ICs) typically use multiple layers of metal within the chip to perform interconnections between active elements. The metal interconnects route signals around the chip as necessary to achieve the intended function. As integrated circuits become smaller and more dense, the lines interconnecting active elements become narrower and more closely packed together. Therefore, the resistance of each interconnect line increases as cross-sectional area decreases. Likewise, the capacitance between adjacent interconnect lines increases with less spacing. Thus, increasing densities spawn slower operating speeds because of the interconnect requirements. Another problem occurs during electro-migration where high temperatures and high current density create voids in the metal and eventually open-circuits the interconnect lines.

Prior art solutions have considered low dielectric insulators and higher conductivity metals for higher density ICs. Nonetheless, VLSI designs continue to struggle with speed vs. density trade-offs. With each additional metal layer to handle the large number of functioning active elements, more masking steps are necessary which adds expense and complexity to the IC.

One known IC technique involves making use of flip-chip designs for multi-chip modules. The IC is fabricated with solder bumps on one side. The ICs are placed on a printed circuit board and the solder bumps are reflowed to make permanent electrical contact between the IC and the printed circuit board. The solder bumps on flip-chip ICs usually on the order of 10 mils (0.0254 millimeters) in diameter with 10 mil spacings. The solder bumps take the place of conventional wire bonding in routing input and output signals to and from the IC. However, the solder bumps do not replace the interconnect layers within the IC. Therefore, prior art flip-chips have not solved the problem of maintaining high speed operation with increasing IC density. Moreover, once the flip-chips are joined together it becomes impractical to separate the union.

Hence, a need exists to interconnect high density ICs while maintaining high operating performance and yet be able to readily separate and rejoin the interconnects.

DETAILED DESCRIPTION OF THE PREFERRED EMBODIMENT

Generally, the present invention relates to a method of electrically and mechanically interconnecting two high density integrated circuits with plug and receptacle interconnects. While surfaces of a variety of types, and for a variety of purposes may be connected together, a preferred use of the present invention is for the electrical and mechanical interconnection of two integrated circuit chips, or for the connection of an integrated circuit chip to another substrate, e.g. alumina, for use in multi-chip modules or hybrid applications. The interconnections are separable and reusable.

Figure 1:
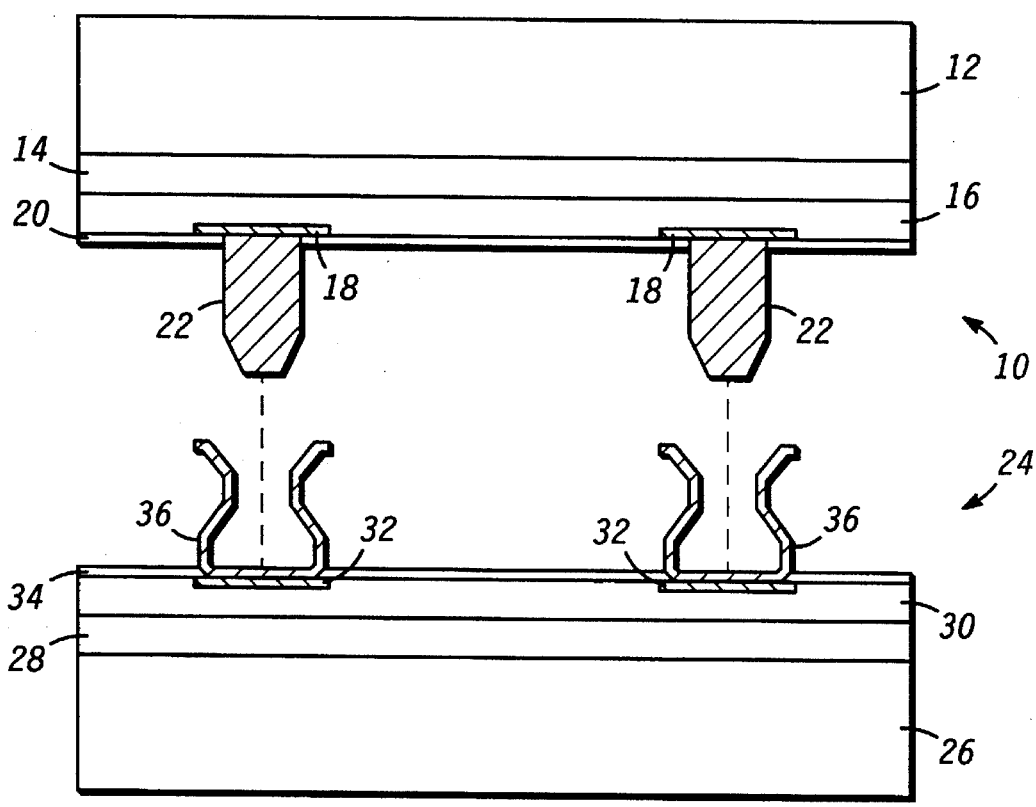
FIG. 1 is a simplified illustration of inter-substrate plug and receptacle interconnects-between first and second semiconductor chips.

Referring to FIG. 1, the electrical and mechanical connection of a first semiconductor chip 10 to a second semiconductor chip 24 is shown. Semiconductor chip 10 includes a semiconductor substrate 12 on which has been fabricated an integrated circuit (IC) device layer 14, an interconnect layer 16 and an isolation layer 20. Within interconnect layer 16 are conducting pads 18 which are connected to inter-substrate interconnect plugs 22. IC device layer 14 and interconnect layer 16 are highly symbolic layers which in fact can be quite complex, and in many cases are not strictly restricted to layers as indicated, but may be interspersed with one another. IC device layer 14 includes passive and active circuit elements formed using standard IC industry processing steps such ion implantation, thermal diffusion, wet and dry etching, physical and chemical deposition, and photolithographic techniques. Interconnect layer 16 includes possibly complex configurations of conductors and dielectrics, possibly in multiple layers, which serve the function of interconnecting passive and active devices into circuits or sub-circuits. Pads 18 are conducting locations that serve as a mechanical base for inter-substrate connecting plugs 22 and also serve to interconnect plugs 22 with other conductors in interconnect layer 16 which in turn connect with circuit elements in IC device layer 14. Isolation layer 20 serves as passivation of the conducting layers in interconnect layer 16 and also functions as an etch differentiation layer during the fabrication process.

In like manner, second semiconductor chip 24 includes semiconductor substrate 26, IC device layer 28, interconnect layer 30 and isolation layer 34. Within interconnect layer 30 are conducting pads 32 which are connected to inter-substrate interconnect receptacles 36. IC device layer 28 includes passive and active circuit elements formed using standard IC industry processing steps. Interconnect layer 30 includes possibly complex configurations of conductors and dielectrics, possibly in multiple layers, which serve the function of interconnecting passive and active devices into circuits or sub-circuits. Pads 32 are conducting locations that serve as a mechanical base for inter-substrate connecting receptacles 36 and also serve to interconnect receptacles 36 with other conductors in interconnect layer 30 which in turn connect with circuit elements in IC device layer 28. Isolation layer 34 serves as passivation of the conducting layers in interconnect layer 30 and also functions as an etch differentiation layer during the fabrication process.

In one embodiment of the present invention, semiconductor chips 10 and 24 are electrically and mechanically interconnected by aligning and inserting inter-substrate interconnect plugs 22 into inter-substrate interconnect receptacles 36. The sides of receptacles 36 are flexible and elastic such that plugs 22 are gripped and retained by receptacles 36. This elastic, gripping action serves multiple purposes; 1) it ensures that once semiconductor chip 10 is engaged with semiconductor chip 24, the two chips remain contacted unless forcible pulled apart; 2) it provides better electrical contact reliability by the sliding action of insertion which can puncture through thin oxides or surface contamination; and 3) once contact is made, the pressure due to the gripping action can serve to maintain a gas-tight seal to ensure long term reliability for electrical contact.

Depending on the height, thickness, material type and required deflection, it is very possible that receptacles 36 may break, or be permanently distorted. Thus, it is necessary to select the proper combinations of material and geometrical properties to form plugs 22 and receptacles 36. For example, if the height of receptacles 36 is 4 μm, the thickness is 0.2 μm, and the material is polysilicon, calculations indicate that the opening of receptacles 36 could be expanded by 0.5 μm and the stress level within the material would be approximately one-tenth of the published yield, or fracture stress. At the same time, the gripping effect of hundreds or even thousands of receptacles 36, should provide very substantial mechanical retention.

The insertion process should be accomplished in very clean conditions and semiconductor chips 10 and 24 must be precisely positioned in order to achieve insertion. Robotic placement of two chips relative to one another can currently be achieved to an accuracy better than 1.0 μm, and this is sufficient for certain useful sizes of inter-chip interconnect plugs 22 and receptacles 36.

It should be clear that the insertion and separation process can be repeated numerous times. The separable nature is beneficial to allow testing to be achieved on separate system components before final assembly, as a means of repairing complex systems, and as a way to provide overall system flexibility through the substitution of components.

Figure 2:
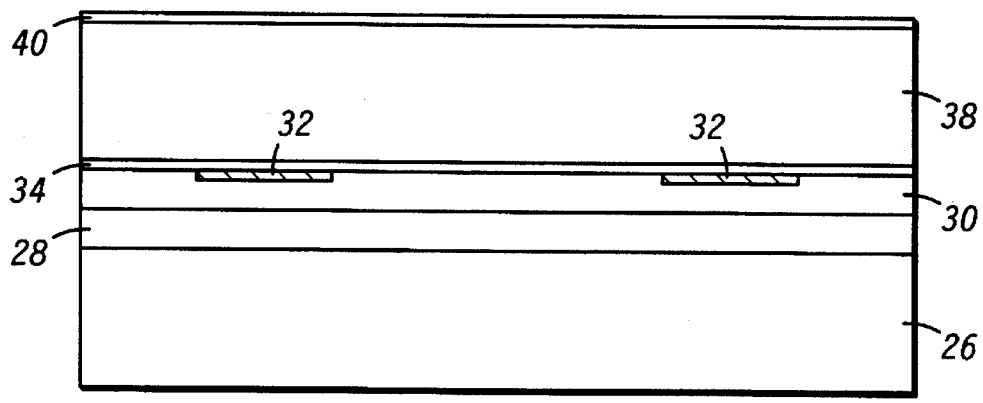
FIGS. 2–6 illustrate a process of forming the inter-substrate receptacle interconnects of FIG. 1.

FIGS. 2–6 illustrate a process sequence suitable for fabrication of interconnect receptacles 36. In FIG. 2, semiconductor substrate 26 is shown after completion of fabrication steps which have formed IC device layer 28, interconnect layer 30, conducting pads 32 and isolation layer 34. In addition, FIG. 2 illustrates a dielectric layer 38 followed by photoresist layer 40. Dielectric layer 38 is prepared in such a manner as to have an etch rate that is dependent on height above isolation layer 34 in order that in a subsequent step, see FIG. 4, an isotropic etch results in a predetermined wall shape.

In one embodiment of this invention, dielectric layer 38 is a phosphosilicate glass (PSG) with a vertically varying concentration of $P_2O_5$. The etch rate of PSG in HF varies dramatically with the $P_2O_5$ concentration. For example, the etch rate of 450° C.-deposited PSG in HF varies from about 25 Å/sec to 200 Å/sec if the concentration of $P_2O_5$ varies from 0 to 8 mole %. PSG is achieved by a chemical vapor deposition reaction using $SiH_4$, $PH_3$ and $O_2$ and the resulting $P_2O_5$ concentration may be controlled through control of the $PH_3$ concentration. By programming the concentration of $PH_3$ during deposition, the desired etch rate profile can be achieved. It should be clear, however, that other dielectric materials, etches and deposition variables may be utilized to achieve similar results.

Figure 3:
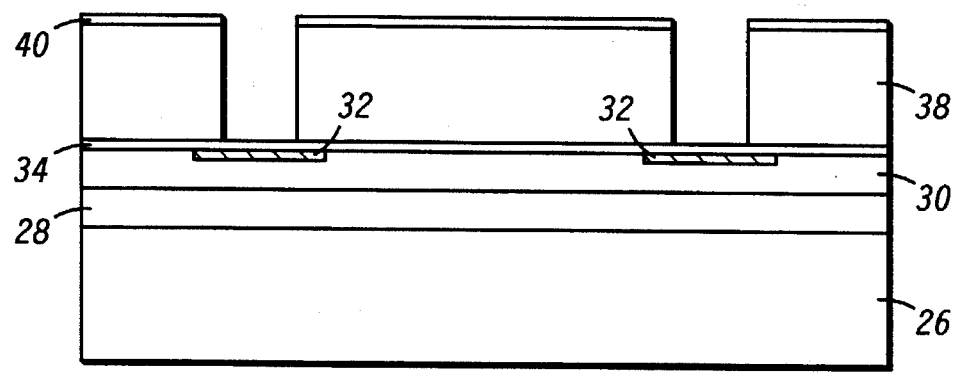

Turning to FIG. 3, a mask is used to expose and develop photoresist 40 which opens the photoresist in locations where receptacles 36 of FIG. 1 are to be formed. An anisotropic reactive ion etching (RIE) process is then used to remove dielectric material 38 in vertical trenches of approximately 3–4 μm in depth as shown in FIG. 3. Isolation layer 34 is chosen primarily as an etch-stop for a subsequent wet etch, but can also be used, together with laser interferometry, to provide an etch-rate signal during RIE to indicate when dielectric layer 38 has been etched through. Alternatively, pads 32 can serve as an etch stop for the RIE etch. Although various etches and isolation layers might be used, isolation layer 34 is selected as $Si_3N_4$ in the present embodiment, the anisotropic etch is an RIE etch using halogen chemistries, such as $CHF_3 + O_2$, and pads 32 are doped polysilicon. These selections provide high temperature processing capabilities, good passivation, and good etch differentiation for the various etching steps.

Figure 4:
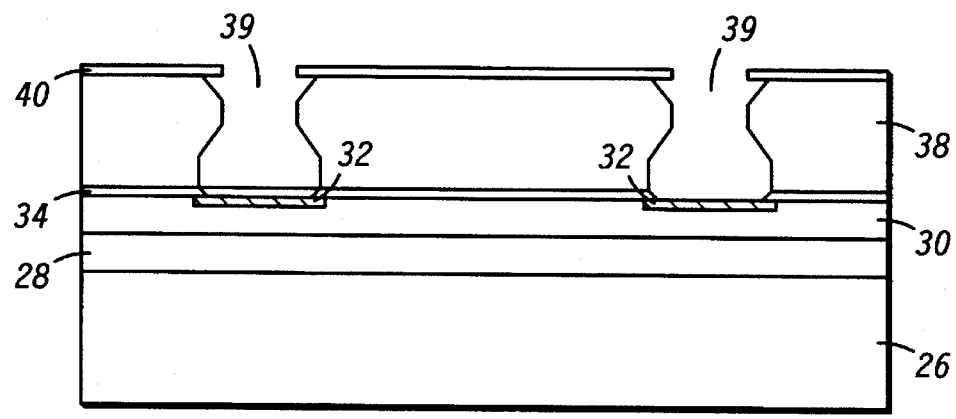

In FIG. 4, an HF etch is used to etch dielectric layer 38 in an isotropic manner, but with an etch rate dependent on the concentration of $P_2O_5$ in dielectric layer 38, which varies as a function of height, resulting in a predetermined shaped region (cavity) 39 as shown. Subsequent to the HF etch, an additional etch, such as phosphoric acid, is used to ensure that isolation layer 34 is cleared from the surface of pads 32.

Figure 5:
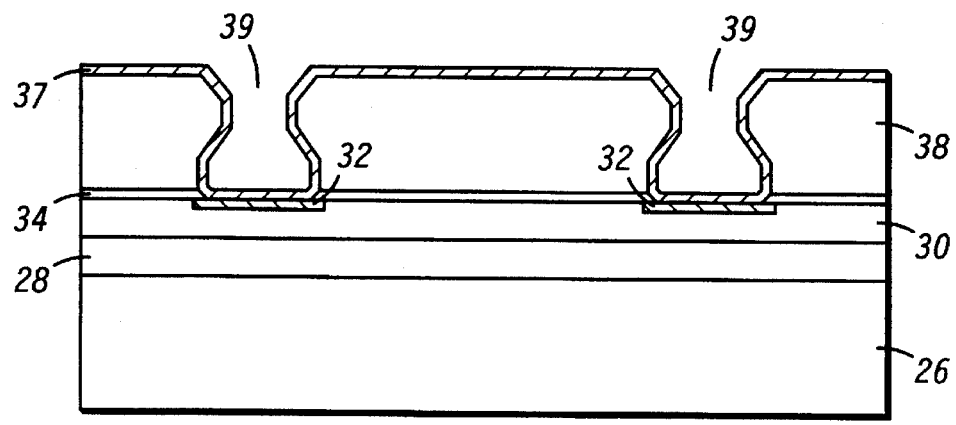

Referring to FIG. 5, photoresist layer 40 of FIG. 4 has been stripped, and then, following cleaning steps to ensure all organics have been removed, conductive layer 37 is conformally deposited to a predetermined thickness. Conductive layer 37 is heavily doped polysilicon deposited to a thickness of around 0.2 μm. Use of low pressure CVD to deposit polysilicon conductive layer 37 is known to allow highly conformal deposition even into extremely small openings, and will allow even smaller geometries.

Figure 6:
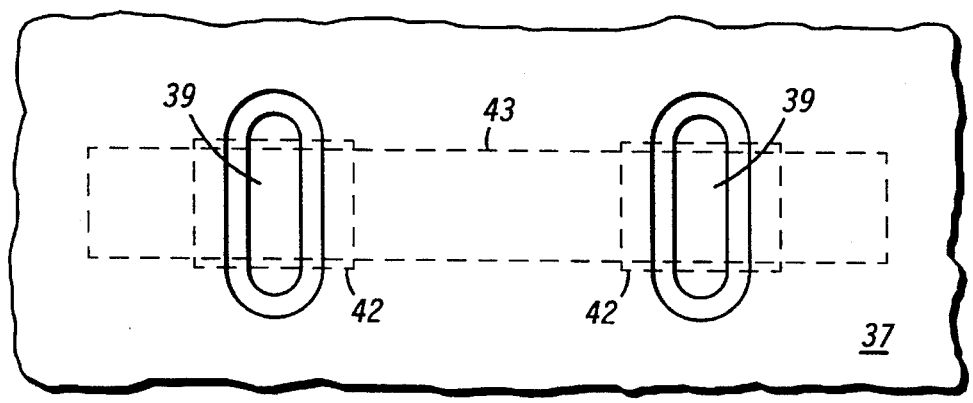

In FIG. 6, conductive layer 37 is shown as a top view. The shaped regions 39 which are to become receptacle connectors 36 of FIG. 1 are at this stage tub-like cavities with closed ends and joined together by conducting layer 37 on the surface. In order to achieve the free-standing, receptacle-like configuration depicted in FIG. 1, conducting layer 37 must be etched to provide isolated receptacles 36. In order for the sides of receptacles 36 to be flexible, the ends of the tub-like regions of conducting layer 37 are opened for greater flexibility. These steps are accomplished through a sequence of photolithographic and etching steps, which are indicated by photolithographic patterns 42 and 43. In a first sequence, a positive photoresist is applied to the surface, and pattern 42 is formed through exposure and development, which leaves photoresist within the region defined by pattern 42, and exposing the remaining surface of conductive layer 37. An anisotropic etch of conductive layer 37 results in electrically isolated conductive regions, still surrounded by dielectric layer 38 of FIG. 5, and still of a tub-like configuration.

Next, photoresist is again applied and patterned such that photoresist is left inside pattern 43. At this point, an anisotropic etch of dielectric layer 38 of FIG. 5 is implemented to remove all of dielectric layer 38 down to isolation layer 24. Isolation layer 24 can serve as an end-point signal. This step exposes the ends of the conductive tub-like structures, but leaves the sides of the tub-like structures protected by photoresist on the inside, and dielectric layer 38 on the outside. Some isotropic etching of dielectric 38 may be necessary to adequately expose the ends of the tubs. Consequently, an isotropic etch of conductive layer 37 for a predetermined time, opens the ends of the tub-like structures. Finally, a strip of the photoresist, and an isotropic etch of dielectric layer 38 completely removes all remaining dielectric material 38, resulting in the free-standing receptacles 36 as shown in FIG. 1. Alternately, the ends of tub-like regions of conducting layer 37 may be left closed for certain combinations of plug and receptacle geometries which provide sufficient flexibility without opening the ends of the tub-like structures.

In the preceding, the anisotropic etch for dielectric layer 38 is an RIE etch using halogen chemistry, e.g. $CHF_3 + O_2$. The polysilicon etch for dielectric layer 37 is an isotropic silicon etch having high selectivity with respect to dielectric layers 38 and 34. The isotropic etch for dielectric layer 38 is HF which has a high selectivity against polysilicon layer 37 and $Si_3N_4$ isolating layer 24. Alternative etch sequences, and etch chemistries may also be considered, depending on the materials used for conducting layer 37, isolating layer 24 and dielectric layer 38. With the proper combination of materials and etch chemistries, a single anisotropic etch using pattern 42 achieves the same results as the foregoing, more complex procedure.

Figure 7:
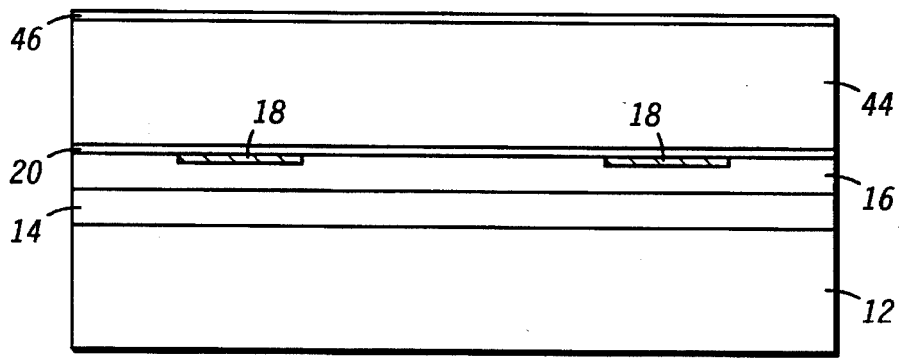
FIGS. 7–11 illustrate a process of forming the inter-substrate plug interconnects of FIG. 1.

FIGS. 7–11 depict a process for fabricating plugs 22 of FIG. 1. In FIG. 7, substrate 12 has already undergone conventional processing resulting in IC device layer 14, interconnect layer 16, isolation layer 20 and conducting pads 18. Dielectric layer 44 is deposited with a predetermined variation of composition so as to achieve an etch rate that varies with height above isolation layer 20. As described earlier, phosphosilicate glass (PSG) with a variation of $P_2O_5$ content gives such properties when etched with HF. Photoresist layer 46 is then deposited on dielectric layer 44.

Figure 8:
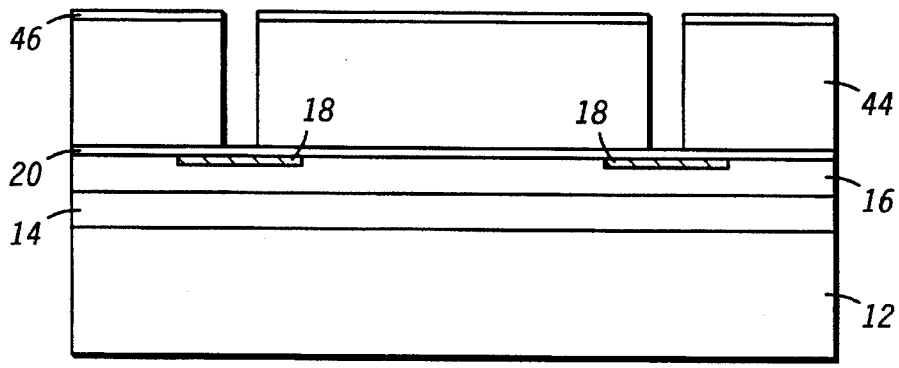
Figure 9:
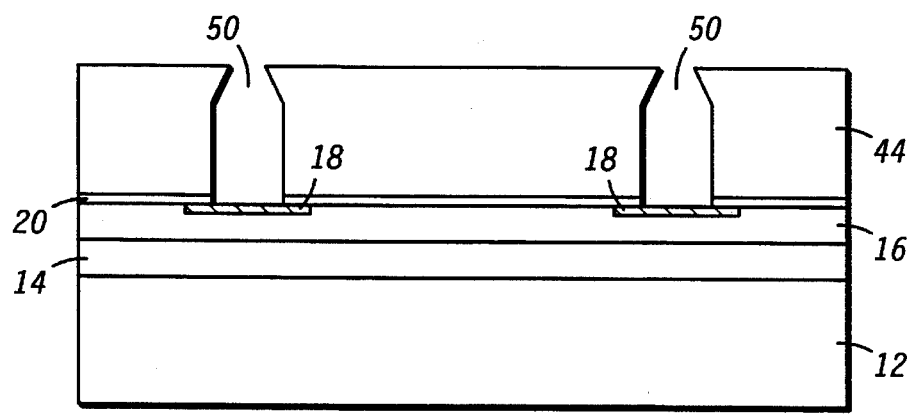

Turning to FIG. 8, photoresist layer 46 is patterned to define locations for interconnect plugs 22 of FIG. 1 and a combination of an anisotropic etch followed by an isotropic etch, as described for FIGS. 3 and 4, results in the shaped regions 50 of FIG. 9. Photoresist layer 46 is removed.

Figure 10:
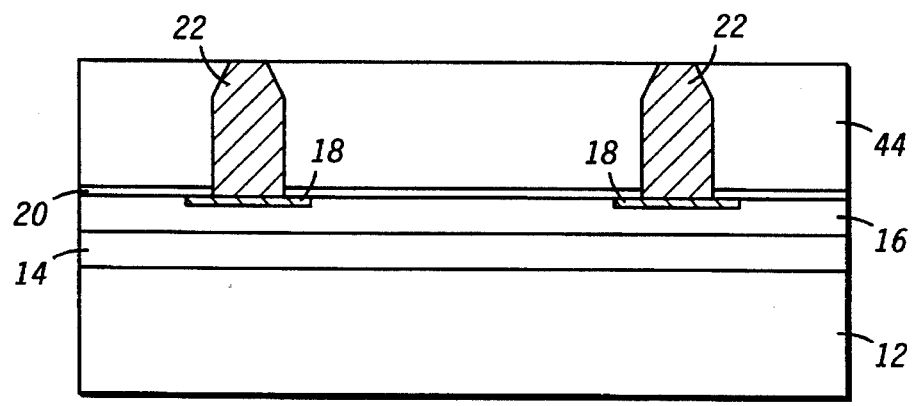

In FIG. 10, interconnect plugs 22 have been formed by a selective deposition process, which nucleates at the surface of pads 18 and fills the cavity of regions 50 with a conductive material. For the preferred embodiment, pads 18 are heavily doped polysilicon, and plug-like members 22 are also heavily doped polysilicon, which can be selectively deposited using CVD of $SiH_4 + H_2$. Besides polysilicon, other conductive materials and methods may be considered, e.g. selective deposition of tungsten, or plating of copper, nickel or other conductors.

Figure 11:
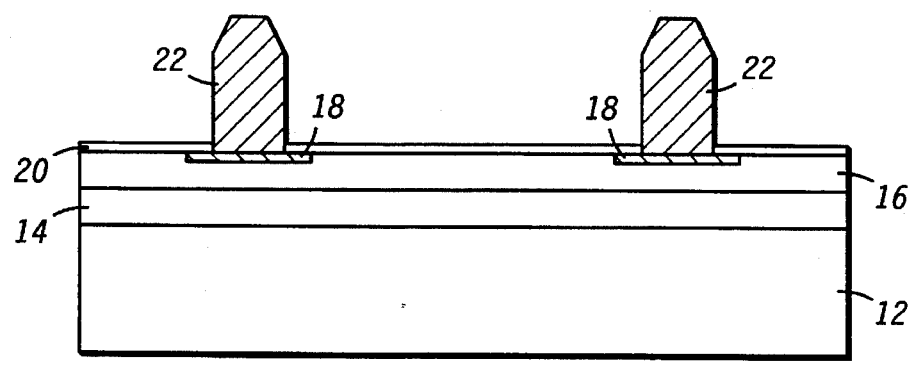

In FIG. 11, dielectric layer 44 is removed by an isotropic etch such as HF which has high selectivity against polysilicon and $Si_3N_4$ leaving plugs 22 protruding from semiconductor chip 10 like that shown in FIG. 1.

The configuration of interconnect plug 22 and receptacles 36, and the process sequences of FIGS. 2–6 and 7–11 are just one embodiment of the invention. Some other variations which have been considered are the use of a plug 22 with a shape which interlocks with receptacle 36, thereby giving increased retention, and a tendency to draw one surface towards the other. Other variations include the use of additional plated layers on the surfaces of connecting members 22 and 36 such that in final assembly, a short heat treatment causes the two surfaces to be fused together in a more permanent fashion. Pb-Sn alloys are used for this purpose due to their low temperature melting point, and well-known properties. Other uses for the connection technology described here, besides connecting two integrated circuit chips, can also be identified. One further example is a heat dissipation substrate which is attached to active devices and dissipate heat. Micro packages may be built which mount on micro pins on circuit boards. Any application where it is beneficial to attach one surface to another in predetermined locations, and at high resolution, may benefit from this invention.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A method of connecting first and second semiconductor substrates, comprising the steps of:

forming a plug member on the first semiconductor substrate coupled to a node of the first semiconductor substrate; and forming a receptacle member on the second semiconductor substrate coupled to a node of the second semiconductor substrate, said plug member being adapted for insertion into said receptacle member to interconnect the first and second semiconductor substrates.

2. The method of claim 1 wherein said step of forming a receptacle member includes the steps of:

providing the second substrate with an isolation layer disposed on said node of the second substrate; and disposing a dielectric layer having a predetermined variation in composition on said isolation layer to achieve an etch rate varying with height above said isolation layer.

3. The method of claim 2 wherein said step of forming a receptacle member includes the step of depositing a masking layer on said dielectric layer.

4. The method of claim 3 wherein said step of forming a receptacle member further includes the steps of:

etching said dielectric to form a shaped region dependent on said varying etch rate; and etching said isolation layer to expose a portion of said nodes below said shaped region.

5. The method of claim 4 wherein said step of forming a receptacle member includes the steps of:

stripping said masking layer;

depositing a conformal conducting layer in said shaped region to form a receptacle wall; and removing said dielectric layer by etching process to leave said receptacle member protruding from the second substrate.

6. A method of connecting first and second substrates, comprising the steps of:

forming a plug member on the first substrate coupled to a node of the first substrate, said step of forming said plug member further including the steps of, (a) providing the first substrate with an isolation layer disposed on said node of the first substrate, and (b) disposing a dielectric layer having a predetermined variation in composition on said isolation layer to achieve an etch rate varying with height above said isolation layer; and forming a receptacle member on the second substrate coupled to a node of the second substrate, said plug member being adapted for insertion into said receptacle member to interconnect the first and second substrates.

7. The method of claim 6 wherein said step of forming a plug member includes the step of depositing a masking layer on said dielectric layer.

8. The method of claim 7 wherein said step of forming a plug member further includes the step of etching said dielectric to form a shaped region dependent on said varying etch rate.

9. The method of claim 8 wherein said step of forming a plug member includes the steps of:

stripping said masking layer;

filling said shaped region with a conductive material; and removing said dielectric layer by etching process to leave said plug member protruding from the first substrate.

10. A method of connecting first and second semiconductor substrates, comprising the steps of:

forming a plug member on the first semiconductor substrate coupled to a node of the first semiconductor substrate;

forming a receptacle member on the second semiconductor substrate coupled to a node of the second semiconductor substrate;

inserting said plug member into said receptacle member to interconnect the first and second semiconductor substrates; and removing said plug member from said receptacle member to disconnect the first and second semiconductor substrates.

11. The method of claim 10 wherein said step of forming a plug member includes the steps of:

providing the first substrate with an isolation layer disposed on said node of the first substrate; and disposing a dielectric layer having a predetermined variation in composition on said isolation layer to achieve an etch rate varying with height above said isolation layer.

12. The method of claim 11 wherein said step of forming a plug member includes the step of depositing a masking layer on said dielectric layer.

13. The method of claim 12 wherein said step of forming a plug member further includes the steps of:

etching said dielectric to form a shaped region dependent on said varying etch rate;

stripping said masking layer;

filling said shaped region with a conductive material; and removing said dielectric layer by etching process to leave said plug member protruding from the first substrate.

14. The method of claim 10 wherein said step of forming a receptacle member includes the steps of:

providing the second substrate with an isolation layer disposed on said node of the second substrate; and disposing a dielectric layer having a predetermined variation in composition on said isolation layer to achieve an etch rate varying with height above said isolation layer.

15. The method of claim 14 wherein said step of forming a receptacle member includes the step of depositing a masking layer on said dielectric layer.

16. The method of claim 15 wherein said step of forming a receptacle member further includes the steps of:

etching said dielectric to form shaped regions dependent on said varying etch rate; and etching said isolation layer to expose a portion of said node below said shaped region.

17. The method of claim 16 wherein said step of forming a receptacle member includes the steps of: stripping said masking layer; depositing a conformal layer in said shaped region to form a receptacle wall; and removing said dielectric layer by etching process to leave said receptacle member protruding from the second substrate.

\* \* \* \* \*